(12) United States Patent
How et al.

(10) Patent No.: US 8,018,050 B2
(45) Date of Patent: Sep. 13, 2011

(54) INTEGRATED CIRCUIT PACKAGE WITH INTEGRATED HEAT SINK

(75) Inventors: You Chye How, Melaka (MY); Shee Min Yeong, Melaka (MY)

(73) Assignee: National Semiconductor Corporation, Santa Clara, CA (US)

(*) Notice: Subject to any disclaimer, the term of this patent is extended or adjusted under 35 U.S.C. 154(b) by 393 days.

(21) Appl. No.: 11/933,990

(22) Filed: Nov. 1, 2007

(65) Prior Publication Data
US 2009/0115037 A1    May 7, 2009

(51) Int. Cl.
*H01L 23/12* (2006.01)
(52) U.S. Cl. .......... 257/704; 257/707; 257/712
(58) Field of Classification Search .......... 257/670, 257/675, 712, 723, 704, 707
See application file for complete search history.

(56) References Cited

U.S. PATENT DOCUMENTS

| | | | | |
|---|---|---|---|---|
| 5,041,902 | A * | 8/1991 | McShane | 257/706 |
| 6,085,830 | A * | 7/2000 | Mashiko et al. | 165/80.3 |
| 6,229,204 | B1 * | 5/2001 | Hembree | 257/675 |
| 6,429,513 | B1 * | 8/2002 | Shermer et al. | 257/714 |
| 6,597,059 | B1 | 7/2003 | McCann et al. | |
| 6,661,087 | B2 | 12/2003 | Wu | |
| 6,849,932 | B2 | 2/2005 | Tsai et al. | |
| 6,916,688 | B1 | 7/2005 | Kelkar et al. | |
| 7,119,431 | B1 | 10/2006 | Hopper et al. | |
| 7,196,904 | B2 | 3/2007 | Ku | |
| 7,332,807 | B2 * | 2/2008 | Dani et al. | 257/706 |
| 2005/0258536 | A1 * | 11/2005 | Lin et al. | 257/717 |
| 2007/0093000 | A1 * | 4/2007 | Shim et al. | 438/123 |
| 2007/0200207 | A1 * | 8/2007 | Ramos et al. | 257/666 |

OTHER PUBLICATIONS

U.S. Appl. No. 11/691,371, filed Mar. 26, 2007.

* cited by examiner

*Primary Examiner* — Steven Loke
*Assistant Examiner* — Kimberly M Thomas
(74) *Attorney, Agent, or Firm* — Beyer Law Group LLP

(57) ABSTRACT

An IC package and methods for making the same are described. The IC package includes a die and a heat sink that is attached to the back surface of the die with a thermal interface material layer. The heat sink includes a base and a partition. The partition extends around the periphery of the base and is offset from the outer edge of the base such that a ledge region is formed that surrounds the periphery of the base. The inner surfaces of the partition define an inner region that includes heat dissipation structures. A molding material encapsulates at least portions of the die and the ledge region around the periphery of the heat sink while leaving the inner region of the heat sink unencapsulated by molding material and exposed. The molding material covering the ledge region provides a locking feature that secures the heat sink in the package.

24 Claims, 11 Drawing Sheets

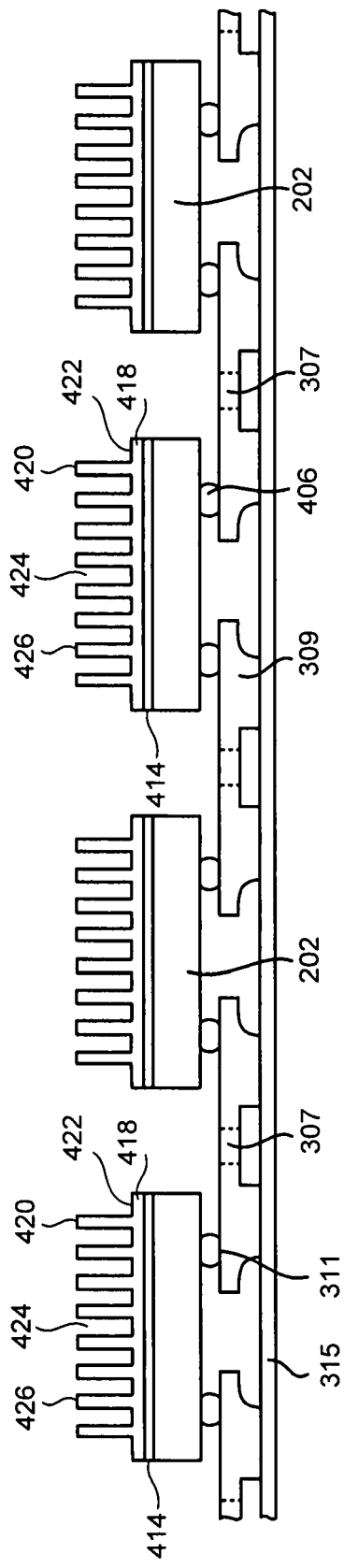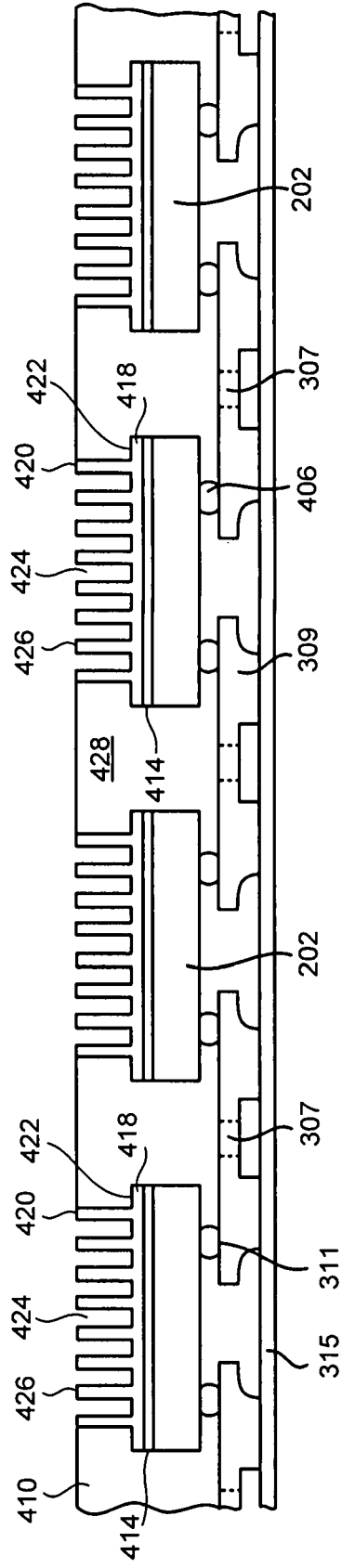

ively connect I/O pads on the active surface of the die to associated solder pads on the leads.

INTEGRATED CIRCUIT PACKAGE WITH INTEGRATED HEAT SINK

TECHNICAL FIELD

The present invention relates generally to the packaging of integrated circuits (ICs). More particularly, the present invention relates to an IC package that includes an integrated heat sink for improved thermal performance.

BACKGROUND OF THE INVENTION

There are a number of conventional processes for packaging integrated circuit (IC) dice. By way of example, many IC packages utilize a metallic lead frame that has been stamped or etched from a metal sheet to provide electrical interconnects to external devices. The die may be electrically connected to the lead frame by means of bonding wires, solder bumps that have been preformed on the active surface of the die, or other suitable electrical connections. In general, the die and portions of the lead frame are encapsulated with a molding material to protect the delicate electrical components on the active side of the die while leaving selected portions of the lead frame exposed to facilitate electrical connection to external devices.

In some applications, it is desirable to leave the back surface (opposite the active surface) of the die exposed; that is, not to encapsulate the back surface of the die with molding material. By way of example, it may be desirable to leave the back surface of the die exposed in order to increase heat dissipation out of the die. This is especially relevant for packages used in power applications. Additionally, in some applications it is desirable to solder or glue a heat sink to the die to help absorb and dissipate heat from the die. Increasing heat dissipation out of an IC die generally results in greater device performance and stability.

While existing arrangements and methods for packaging IC devices work well, there are continuing efforts to improve the thermal performance of IC devices.

SUMMARY OF THE INVENTION

In one aspect, an integrated circuit (IC) package is described. The IC package includes a die having an active surface and a back surface. The active surface includes a plurality of input/output (I/O) pads. A heat sink is attached to the back surface of the die with a thermal interface material layer. The heat sink includes a base and a partition that extends from the top surface of the base. The partition extends around the periphery of the base and is offset from the outer edge of the base such that the partition and base form a ledge region that surrounds the periphery of the base. The inner surfaces of the partition define an inner region on the top surface of the base that includes a multiplicity of heat dissipation structures. The IC package additionally includes a molding material that encapsulates at least portions of the die and the ledge region around the periphery of the heat sink while leaving the inner region of the heat sink unencapsulated by molding material and exposed. Notably, the molding material covering the ledge region provides a locking feature that secures the heat sink in the package.

In various embodiments, the IC package further includes a leadframe. The leadframe may include a plurality of leads each having at least one solder pad and a contact surface that is distinct from the solder pad. Each solder pad is suitably positioned to overlap a corresponding I/O pad on the die. A plurality of solder joint connections physically and electri- In some embodiments, the thermal interface material layer is formed of a thermally conductive adhesive material. In other embodiments, the thermal interface material layer may be formed from solder.

In another aspect, an arrangement is described that includes a wafer, a thermal interface material such as that just described and a multiplicity of heat sinks such as the heat sink just described. The wafer includes a multiplicity of integrally connected integrated circuit dice. The thermal interface material layer is attached to the back surface of the wafer. The multiplicity of heat sinks are attached to the thermal interface material layer above associated dice.

In another aspect, an arrangement is described that includes a plurality of dice, a lead frame panel and a plurality of heat sinks. The lead frame panel includes an array of device areas. Adjacent device areas are connected with associated tie bars. Each device area is suitable to receive an associated die and includes a plurality of leads, having at least one solder pad and a contact surface that is distinct from the solder pad. Each solder pad is suitably positioned to overlap a corresponding I/O pad on the die. A plurality of solder joint connections physically and electrically connect I/O pads on the active surface of each die to associated solder pads on the leads of an associated device area. A thermal interface material layer such as that described above is attached to the back surface of each die. The plurality of heat sinks are each attached to the thermal interface material layer on the back surface of an associated die.

In another aspect, a method of securing heat sinks to back surfaces of integrated circuit dice is described. Each die is positioned onto a device area of a lead frame. I/O pads on the active surface of each die are physically and electrically connected to solder pads on associated leads of the device area of the leadframe with solder joint connections. The method includes applying a thermal interface material layer onto the back surface of each die. The method further includes attaching a heat sink such as that described above to the thermal interface material layer on the back surface of each die. In various embodiments, the method further includes curing the thermal interface material layers to secure the heat sinks to associated dice. The method may also include encapsulating the solder joint connections, dice and portions of the leadframe and heat sinks with a molding material such that the molding material does not enter the inner regions of the heat sinks. The molding material covers portions of the ledge region on each heat sink such that the molding material covering the ledge region provides a locking feature that secures the ledge region within the molding material thereby securing the heat sink to the thermal interface material and the die.

In yet another aspect, an alternate method of securing heat sinks to back surfaces of integrated circuit dice is described. A wafer is provided that includes a multiplicity of integrally connected integrated circuit dice. The method includes applying a thermal interface material layer onto the back surface of the wafer. The method also includes attaching a multiplicity of heat sinks such as those described above to the thermal interface material layer. The method further includes singulating the wafer to provide a multiplicity of integrated circuit dice, each die having a heat sink on its back side.

BRIEF DESCRIPTION OF THE DRAWINGS

For a better understanding of the invention, reference should be made to the following detailed description taken in conjunction with the accompanying drawings, in which:

FIGS. 4A-4E illustrate diagrammatic cross-sectional side views of a wafer in accordance with various embodiments of the present invention.

Like reference numerals refer to corresponding parts throughout the drawings.

DETAILED DESCRIPTION OF EXAMPLE EMBODIMENTS

The present invention relates generally to the packaging of integrated circuits (ICs). More particularly, the present invention relates to an IC package that includes an integrated heat sink for improved thermal performance.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessary obscuring of the present invention.

Various embodiments of the present invention will be described with reference to FIGS. 1-8. Aspects of the present invention provide a method for packaging IC dice such that each resultant package includes a heat sink that is at least partially locked within the package with molding material. Primarily, the heat sink serves to increase thermal dissipation out of the die.

Figure 1:
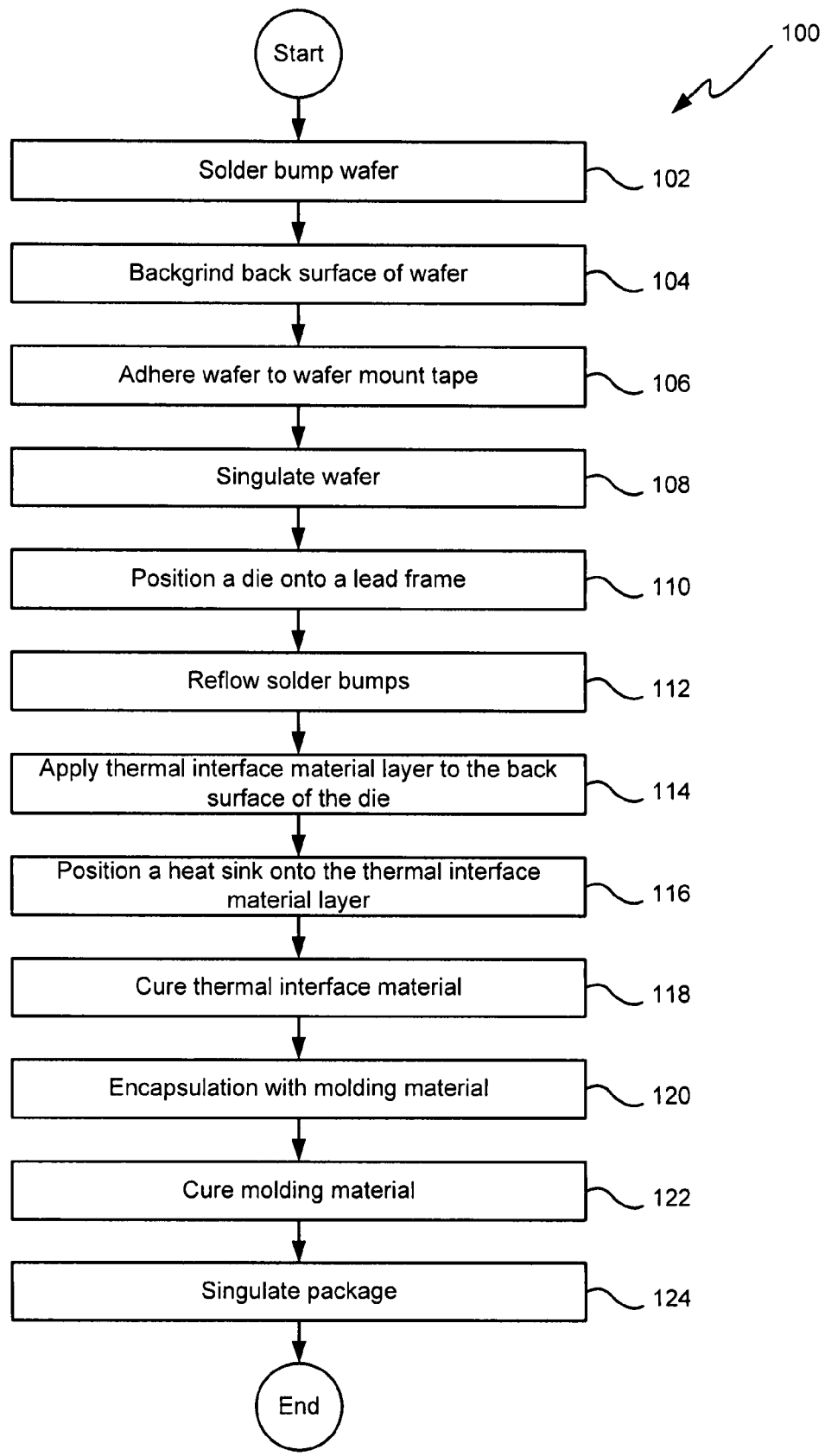
FIG. 1 is a flowchart illustrating a process for packaging IC dice with integrated heat sinks in accordance with an embodiment of the present invention.
Figure 2:
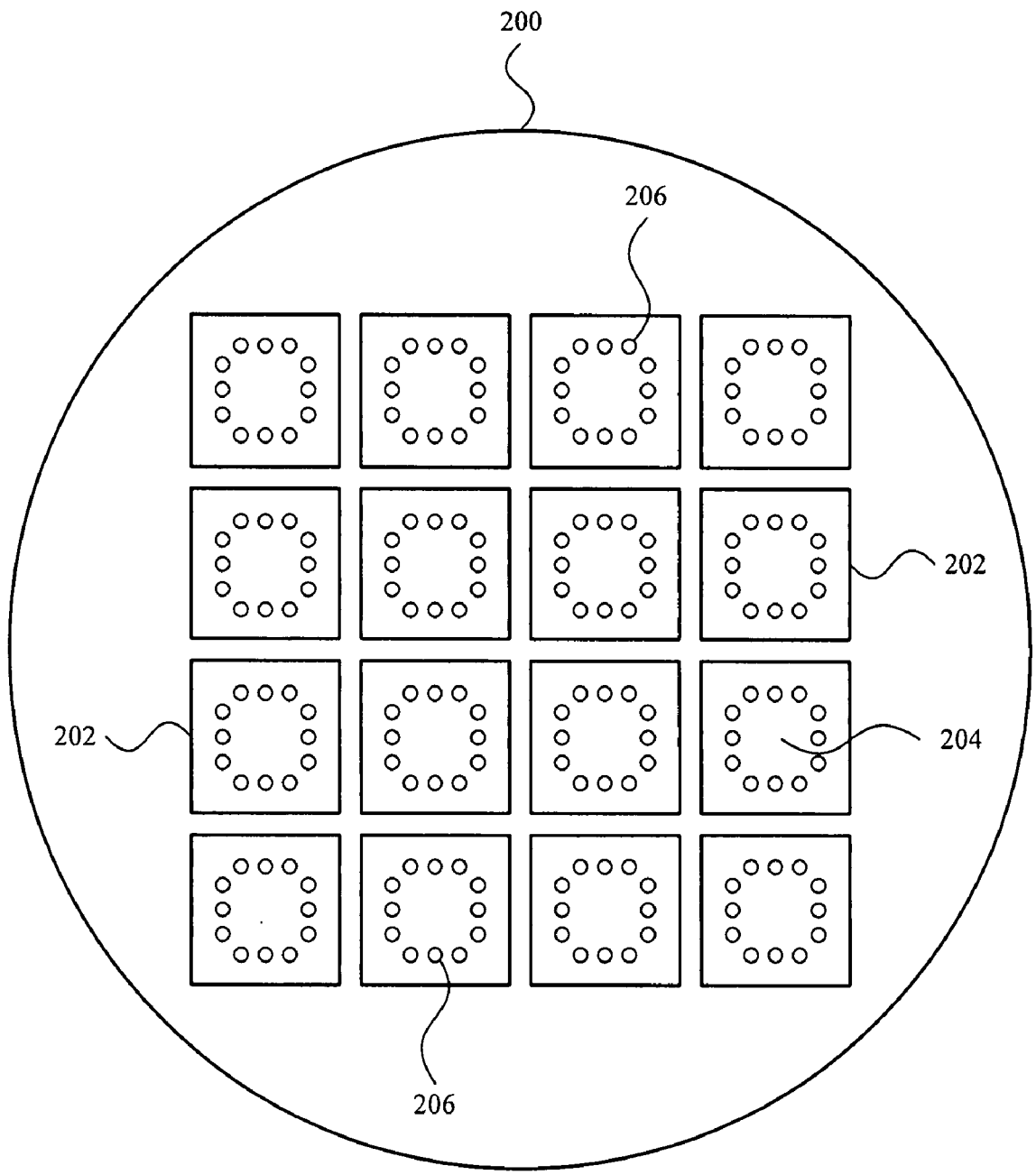
FIG. 2 is a diagrammatic top view of a wafer suitable for use in various embodiments of the present invention.

Referring initially to FIG. 1, and further in view of FIG. 2, a process 100 of preparing and packaging IC dice in accordance with particular embodiments of the present invention will be described. Initially, a semiconductor wafer 200 that includes a large number of dice 202 is fabricated. Although the wafer 200 diagrammatically illustrated in FIG. 2 only includes a few dice 202, it will be appreciated by those familiar with the art that state of the art wafers tend to have on the order of hundreds, to thousands or tens of thousands of dice formed therein and it is expected that even higher device densities will be attained in future wafers. As is well known in the art, most wafers and dice are formed of silicon (Si), although any other appropriate semiconductor material can also be used.

In various embodiments, the active surface 204 of the wafer 200 is solder bumped at 102. The solder bumps 206 may be formed directly on bond pads on the active surfaces of the dice 202 or on other I/O pads that have been redistributed from the bond pads using various redistribution techniques. Additionally, underbump metallizations (UBMs) may be formed on the bond pads of the dice 202 prior to solder bumping. Generally, the solder bumps 206 are intended to be mounted and attached directly to solder pads of a substrate, such as a lead frame or printed circuit board (PCB).

If it is desirable to thin the wafer 200, the back surface (opposite the active surface) of the wafer may be subjected to a backgrinding operation at 104. Backgrinding allows the wafer 200 to be brought into conformance with a desired thickness. Backgrinding may be accomplished by any of a number of methods known in the art. It should be appreciated that backgrinding is an entirely optional operation as the wafer 200 may be in conformance to a desired thickness without backgrinding.

According to various embodiments, the wafer 200 is then adhered at 106 to a wafer mount tape. The wafer 200 is then singulated at 108 into a large number of individual IC dice 202. Singulation may be accomplished through any of a number of suitable manners including sawing, gang cutting (sawing), plasma cutting or laser cutting. The singulation proceeds fully through the wafer 200 thereby completely separating the dice 202 from one another. However, in various embodiments, for ease of handling, the singulation does not proceed fully through the mount tape.

Figure 3A:
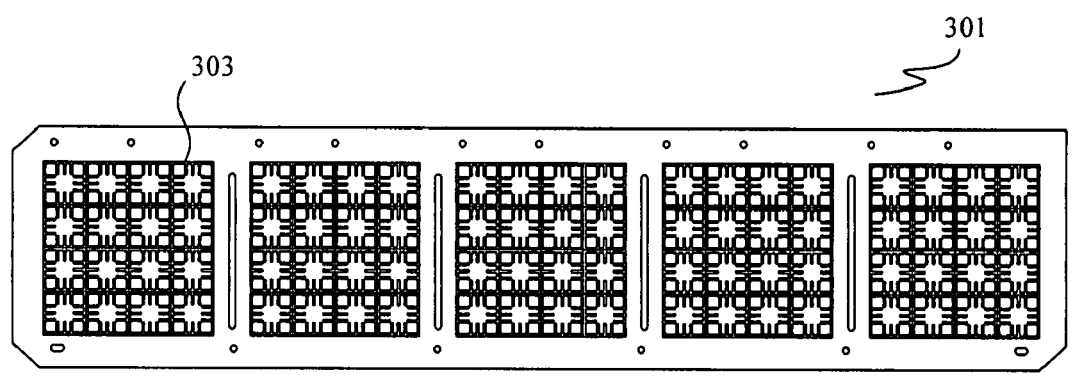
FIGS. 3A-3C illustrate an example lead frame panel suitable for use in various embodiments of the present invention.
Figure 3B:
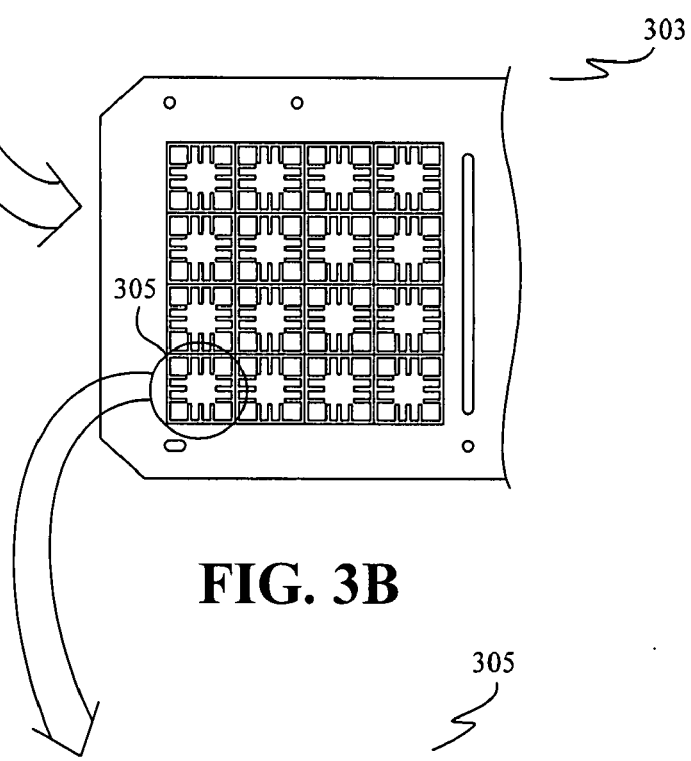
Figure 3C:
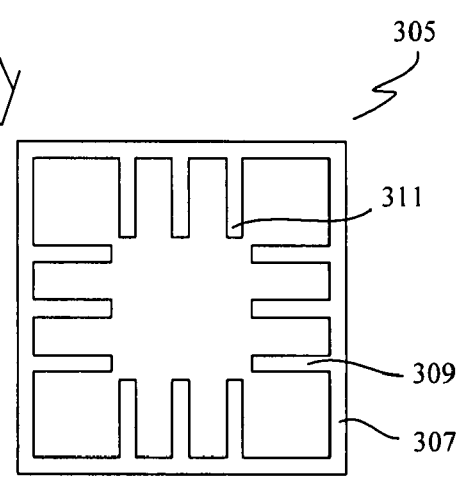

An individual die 202 may then be removed from the tape and positioned onto a suitable substrate at 110. In preferred embodiments, the substrate is a lead frame or lead frame panel. With respect to FIGS. 3A-C, an exemplary lead frame panel 301 suitable for use in packaging integrated circuits according to various embodiments of the present invention will be described. FIG. 3A illustrates a diagrammatic top view of a lead frame panel 301 arranged in the form of a strip. The lead frame panel 301 can be configured as a metallic structure with a number of two-dimensional arrays 303 of device areas. As illustrated in the successively more detailed FIGS. 3B-C, each two-dimensional array 303 includes a multiplicity of device areas 305, each configured for use in a single IC package, and each connected by a matrix of fine tie bars 307.

Each device area 305 may include a number of leads 309, each supported at one end by the tie bars 307. In the illustrated embodiment, the leads 309 include conductive solder pads 311 to provide conductive contact regions to electrically connect the leads to associated solder bumps on the die. The leads 309 additionally include package contacts on the bottom surface of the lead frame. The leads 309 may be etched, half-etched, or otherwise thinned relative to the package contacts, so as to provide electrical connection to the contacts while limiting the exposed conductive areas on the bottom surface of the lead frame panel 301. Additionally, it may also be desirable to etch or otherwise thin the top surface of the lead frame as well. To facilitate handling, and also for encapsulation purposes, the bottom surface of the lead frame may be adhered to a tape 315.

It will be appreciated by those skilled in the art that, although a specific lead-frame panel 301 has been described and illustrated, the described methods may be applied in packaging dice utilizing an extremely wide variety of other lead frame panel or strip configurations as well as other substrates. Thus, although the following description of particular embodiments describes the packaging of dice utilizing lead frame technology, those of skill in the art will understand that embodiments of the present invention may also be practiced using other substrates. Additionally, although described with references to a top and bottom surface of the lead frame panel 301, it should be appreciated that this context is intended solely for use in describing the structure and in no way limits the orientation of the lead frame for subsequent attachment to a PCB or other suitable substrate.

Figure 4A:
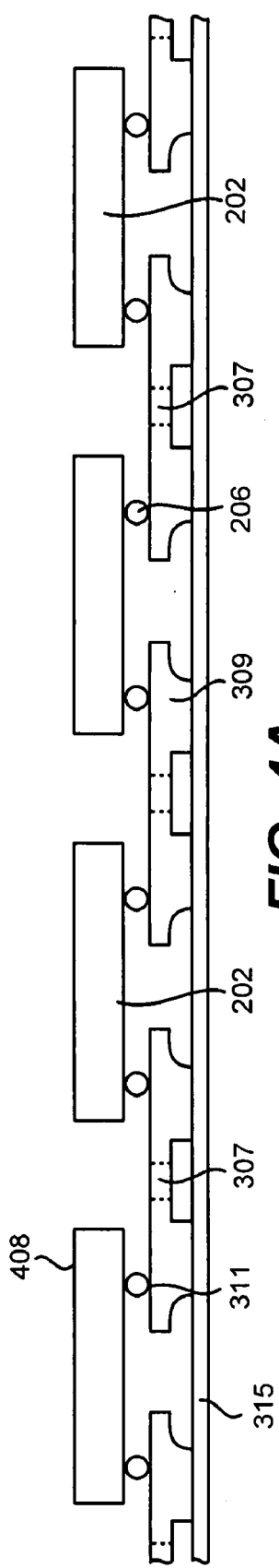
Figure 4B:
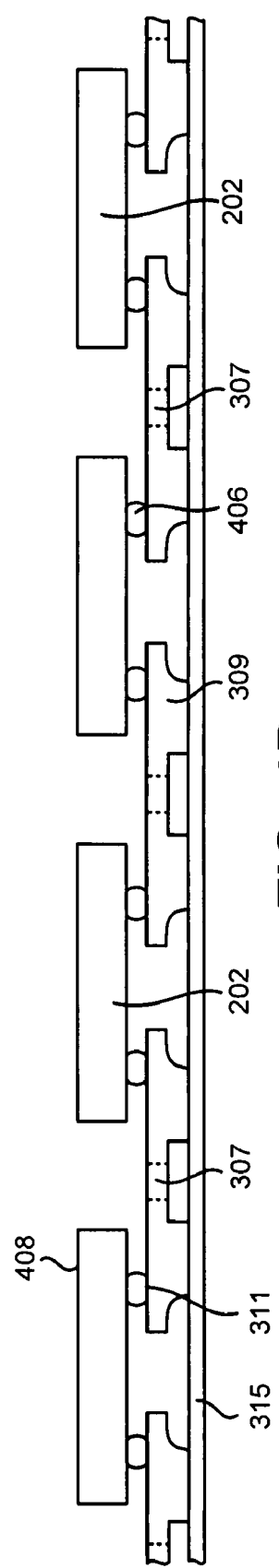

When placing the solder-bumped dice 202 onto the lead frame 301, the solder bumps 206 may be directly positioned onto the solder pads 311 located on the leads 309 of the lead frame as illustrated in FIG. 4A. In embodiments such as these in which the active surface of each die 202 includes a plurality of solder bumps 206, the die is electrically and physically connected to the lead frame 301 by means of reflowing the solder bumps at 112 such that solder joints 406 are formed between the I/O pads on the active surface 204 of the die and the solder pads 311 of the lead frame as illustrated in FIG. 4B.

Figure 4C:
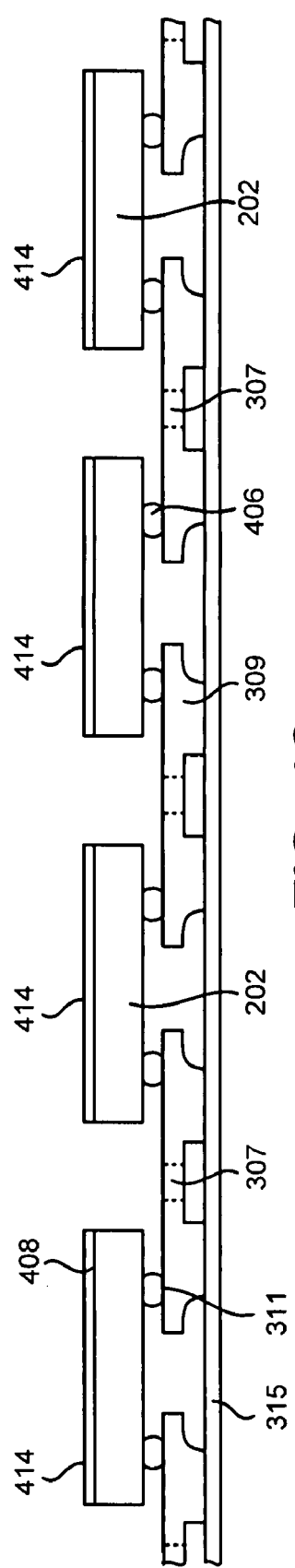

At 114, a thermal interface material layer 414 is applied to the back surface 408 of each die 202 attached to the lead panel 301 as illustrated in FIG. 4C. The thermal interface material layer 414 may be formed of any suitable material(s). Preferably, the thermal interface material layer 414 is formed of one or more of a wide variety of thermally conductive materials. In some embodiments, the thermal interface material layer 414 may consist of a stack of multiple layers of differing materials having varying thermal and adhesive properties. In various embodiments, the thermal interface material layer 414 is formed from a thermally conductive adhesive. In some particular embodiments, the thermally conductive adhesive may be a thermally curable liquid adhesive that is both thermally conductive and electrically insulating. Specifically, when cured, the thermally conductive adhesive may have a thermal conductivity of at least approximately 1.9 W/m° C. However, it will be appreciated by those familiar with the art that a wide variety of other thermally conductive adhesive materials and, more generally, thermal interface materials may be used. By way of example, in some embodiments, the thermal interface material layer 414 is formed from a B-stageable adhesive. A B-stageable adhesive is an adhesive that may be cured in two stages; that is, the B-stageable adhesive may be partially cured at one stage and fully cured at a later stage. If a B-stageable adhesive or similar material is used, the thermal interface material layer 414 may be partially cured by any suitable means.

In some embodiments, the thermal interface material layer 414 is applied to the back surface 408 of each individual die 202 in liquid form using an appropriate dispenser. However, it will be appreciated that any suitable method may be used to deposit the thermal interface material layer 414 onto the back surfaces 408 of the dice 202. Generally, the method of application will depend on the choice of the material used to form the thermal interface material layer 414. The desired thickness of the thermal interface material layer 414 may also vary widely according to the choice of material. By way of example, a thermal interface material layer 414 formed of a thermally conductive adhesive may have a thickness in the range of approximately 20 to 30 microns (μm).

At 116 a heat sink 416 is positioned onto the thermal interface material layer 414 on the back surface of each die 202, as illustrated by the cross-section shown in FIG. 4D. A specific embodiment of an example heat sink 416 will now described with reference to FIG. 4D and further in view of FIGS. 5A-5B. The heat sink 416 includes a base 418. The heat sink 416 also includes a dividing wall or partition 420 that extends around the periphery of the base 418. In the illustrated embodiment, the partition 420 is offset from the outer side edge of the base 418 such that a lip or ledge region 422 is formed around the periphery of the base 418. The inner surfaces of the partition 420 define an inner region 424. Within the inner region 424 are a plurality of heat dissipation structures 426 that rise vertically upwards from the base 418.

Figure 5A:
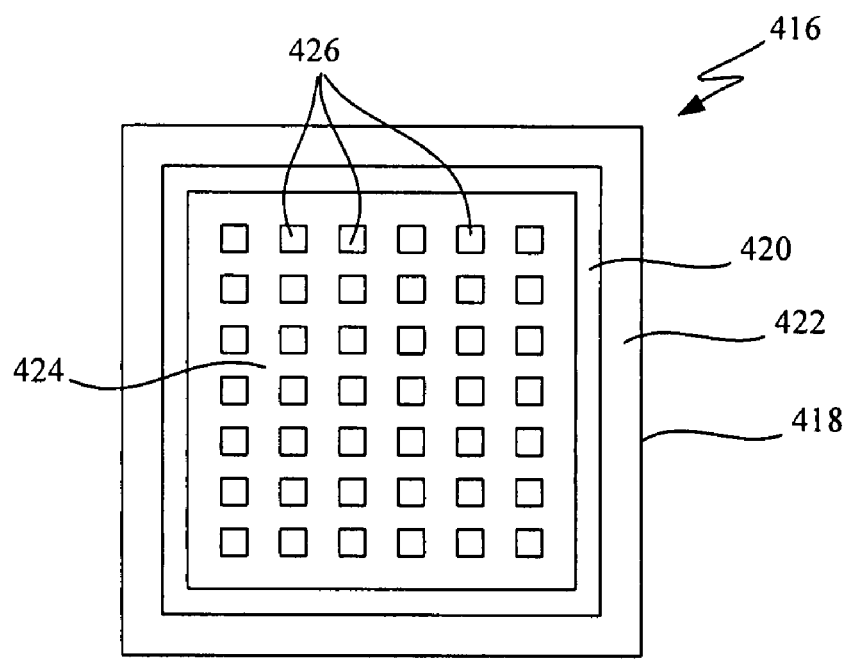
FIGS. 5A-5B illustrate diagrammatic top views of heat sinks suitable for use in accordance with embodiments of the present invention.
Figure 5B:
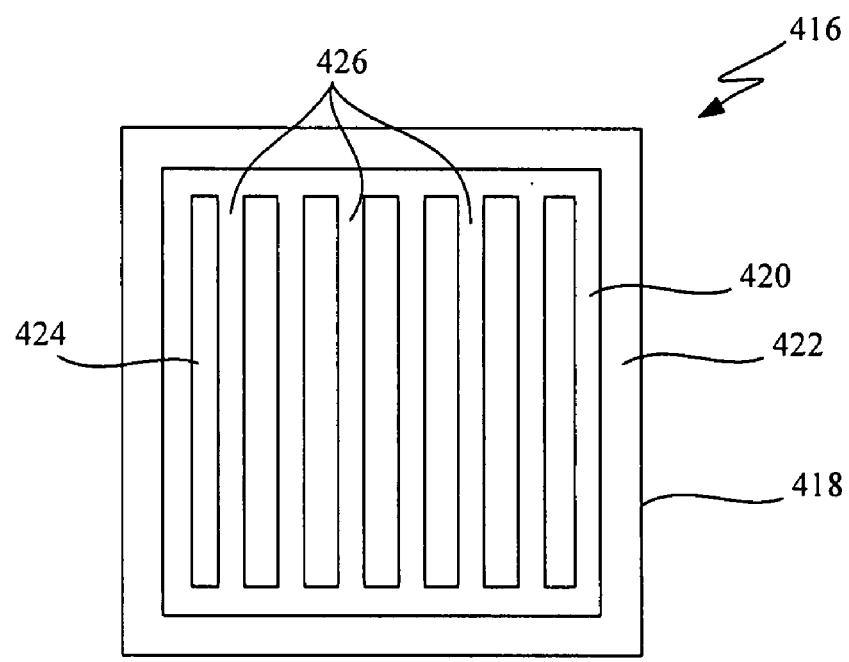

In the embodiment illustrated in FIG. 5A, the heat dissipation structures 426 take the form of vertical posts. Alternatively, in FIG. 5B, the heat dissipation structures 426 take the form of fin-like structures. It will be appreciated by those familiar with the art that the heat dissipation structures 426 may assume a wide variety of shapes and geometries. In the illustrated embodiment, the partition 420 and the heat dissipation structures 426 have the same height relative to the base 418. By way of example, suitable heights for the partition 420 and heat dissipation structures 426 may be in the range of approximately 75 to 250 μm. The thickness of the base 418 may be in the range of approximately 75 to 125 μm. Although specific ranges have been described, a wide range of heights and thicknesses both smaller and larger may be appropriate. However, in some embodiments it is desirable to limit the overall height of the heat sink 416 to keep within a desired package thickness. The widths of the heat dissipation structures 426 and the spacings between the heat dissipation structures may also vary widely.

The partition 420 and heat dissipation structures 426 may be formed by any suitable means. By way of example, a metal sheet or plate may be etched to define the partition 420 and the heat dissipation structures 426. The heat sink 416 may also be formed of any suitable thermally conductive material. By way of example, in various embodiments, the heat sink 416 is formed of copper, a copper alloy, or another suitable metal or metallic alloy. Additionally, in some embodiments, the heat sink 416 is plated with a thin metallic layer such as, for example, nickel, titanium, titanium-tungsten, or nickel-vanadium.

In some embodiments, it is necessary or desirable to cure the thermal interface material at 118 to complete attachment of the heat sink 416 to the thermal interface material layer 414 and hence to the die 202. Depending upon its material composition, the thermal interface material layer 414 may be cured thermally, such as in an oven, through exposure with radiation, such as ultraviolet (UV) radiation, or by any other suitable means.

At 120 portions of the dice 202 and lead frame 301 are encapsulated with a molding material or compound 428. The molding compound is generally a non-conductive plastic or resin having a low coefficient of thermal expansion. In a preferred embodiment, an entire populated lead frame strip, such as lead frame panel 301, is positioned in the mold such that the entire die-populated lead frame panel may be encapsulated substantially simultaneously. It should be appreciated that a lesser number of dice 202 may also be encapsulated at any one time.

It should additionally be appreciated that virtually any molding system may be used to encapsulate the attached dice 202 and lead frame panel 301. By way of example, a film assisted molding (FAM) system may be used to encapsulate the attached dice. In such a system, a vacuum may be used to draw a film or tape to the inner surfaces of the molding cavity. By way of example, the film used within the mold cavity may be a thermoplastic adhesive film. In this way, portions of the lead frame panel 301 and heat sink 416 that would make contact with the mold cavity during encapsulation instead make contact with the adhesive film. Thus, in one embodiment, during encapsulation, the top surface of the partition 420 is in contact with the adhesive film, which is turn in contact with the mold cavity. The adhesive film, too, generally aids in reducing mold compound intrusion over the partition 420. However, FAM systems are not always available or applicable to particular lead frame configurations. Hence, in another embodiment, an adhesive film may not be used whereby the partition 420 itself is in contact with the mold cavity.

During the encapsulation process, the mold cavity is pressed against the top surface of the partition 420. As a result, the partition 420 prevents molding material from entering the inner region 424 where the heat dissipation structures 426 are located. However, molding material does encapsulate the die 202, solder joints 406, portions of the leads 309 and, particularly, the ledge region 422 as illustrated in FIG. 4E.

Figure 6A:
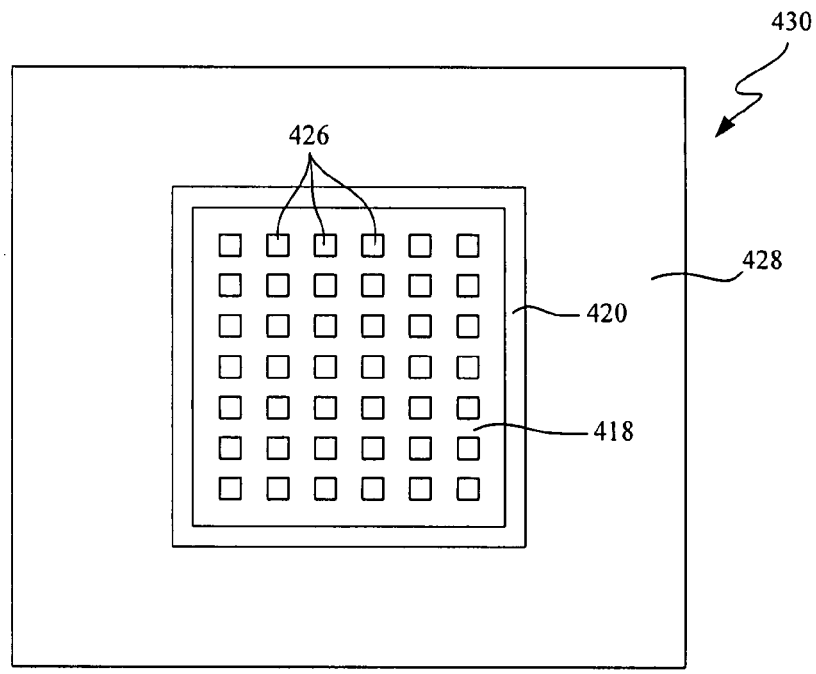
FIGS. 6A-6C illustrate diagrammatic top, bottom and cross-sectional sides views, respectively, of an IC package in accordance with an embodiment of the present invention.
Figure 6B:
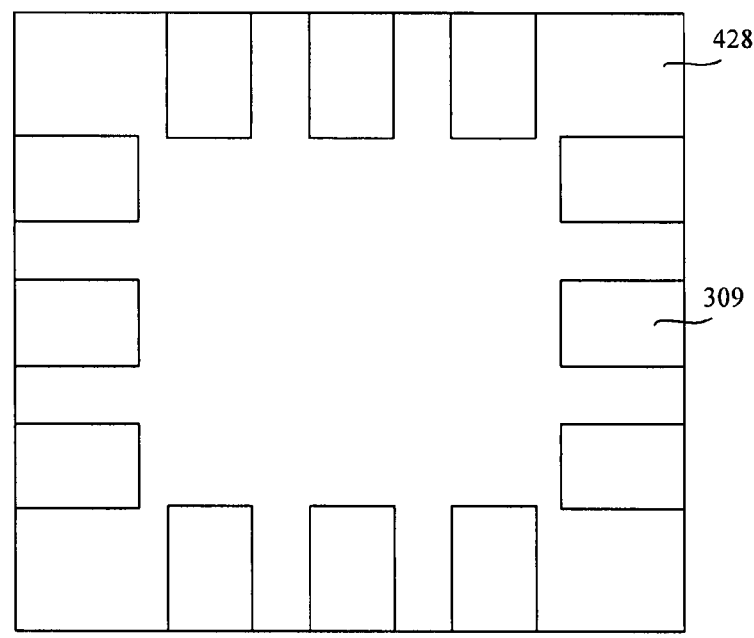
Figure 6C:
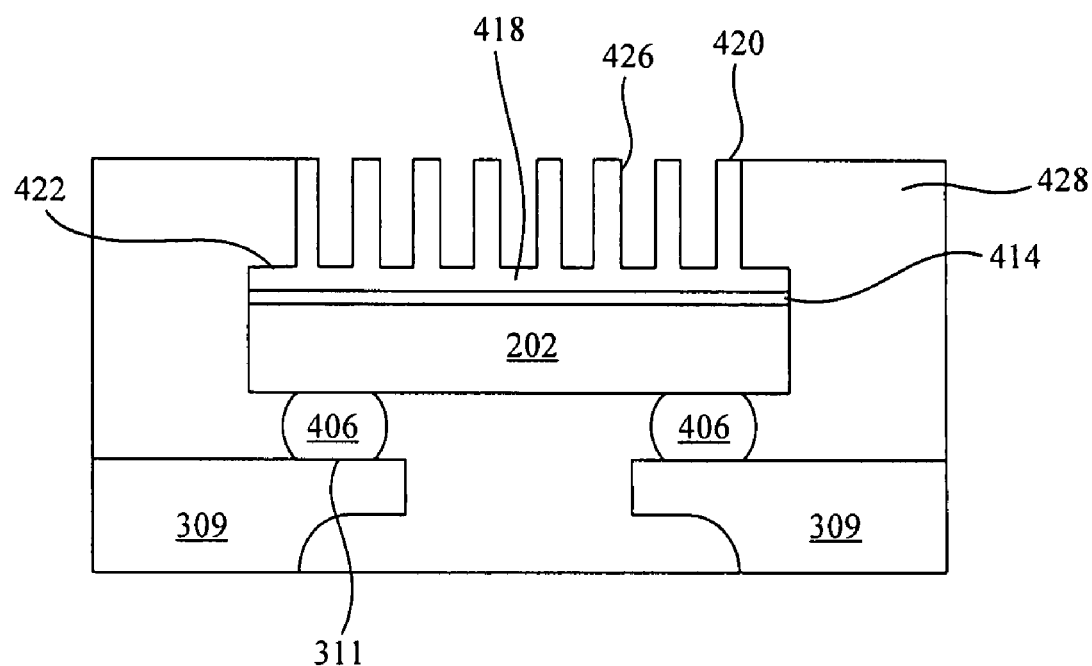
Figure 7A:
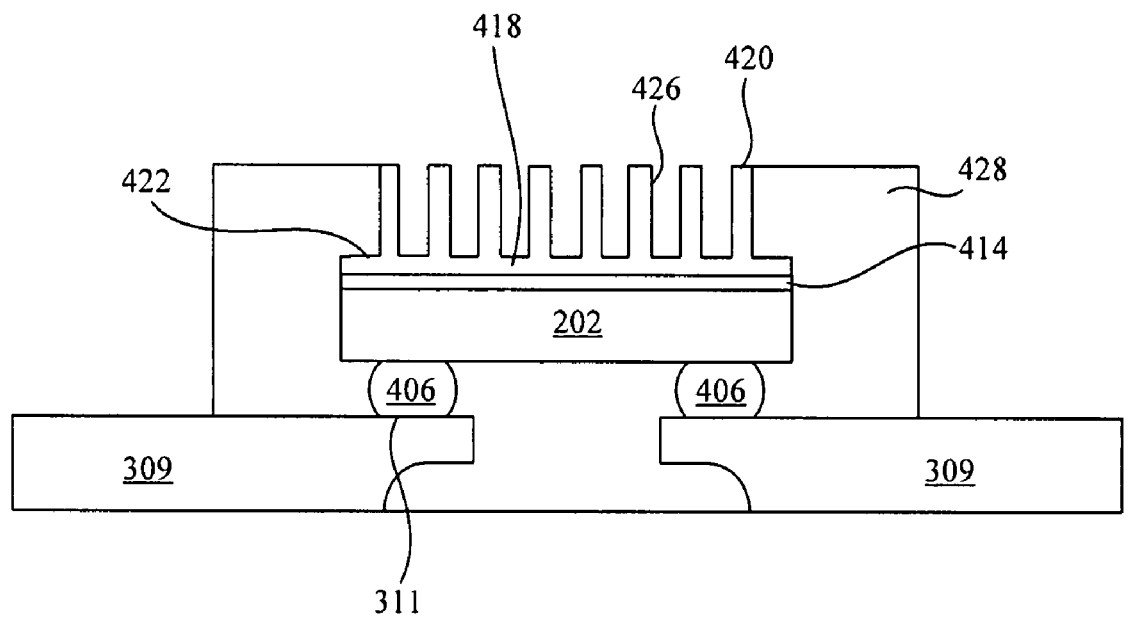
FIGS. 7A-7B illustrate diagrammatic cross-sectional side views of IC packages in accordance with some embodiments of the present invention.
Figure 7B:
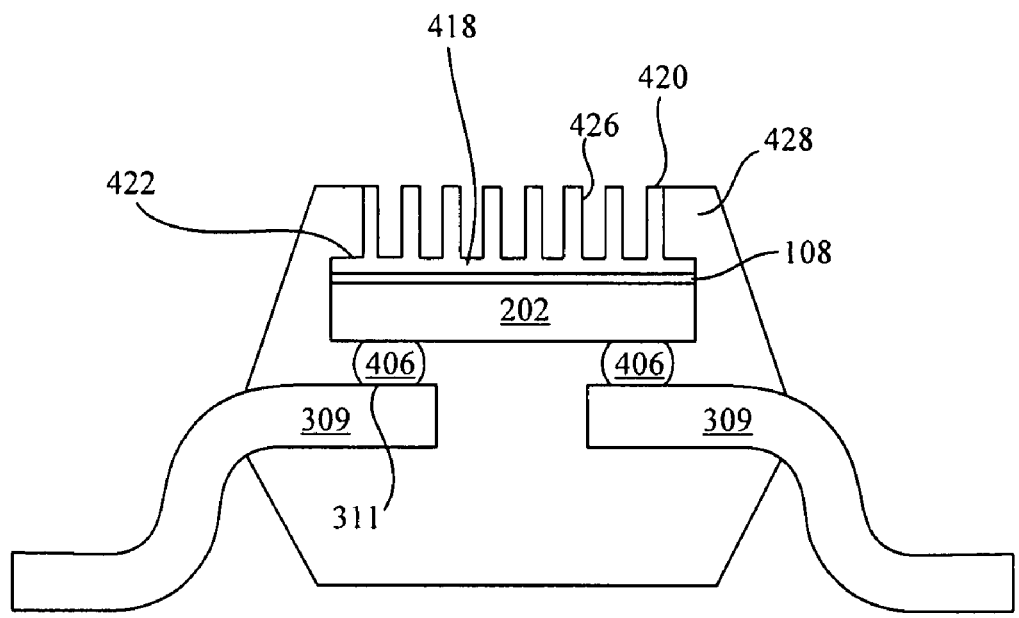

Subsequently, the molding compound may then be cured in a heated oven at 122. After curing the molding compound, the encapsulated lead frame panel 301 may then be singulated at 124 to yield a plurality of individual IC packages 430 each having an integrated heat sink 416 on the back surface of the packaged die 202. Upon package singulation, the IC packages 430 may be attached to PCBs or other desired substrates. FIGS. 6A-6C illustrate enlarged diagrammatic top, bottom and cross-sectional side views of package 430, respectively. FIGS. 7A and 7B illustrate alternate examples of package configurations in accordance with other embodiments. By way of example, in the package illustrated in FIG. 7B, the leads 309 are bent into a gull-wing formation to facilitate electrical connection to a PCB.

Figure 8A:
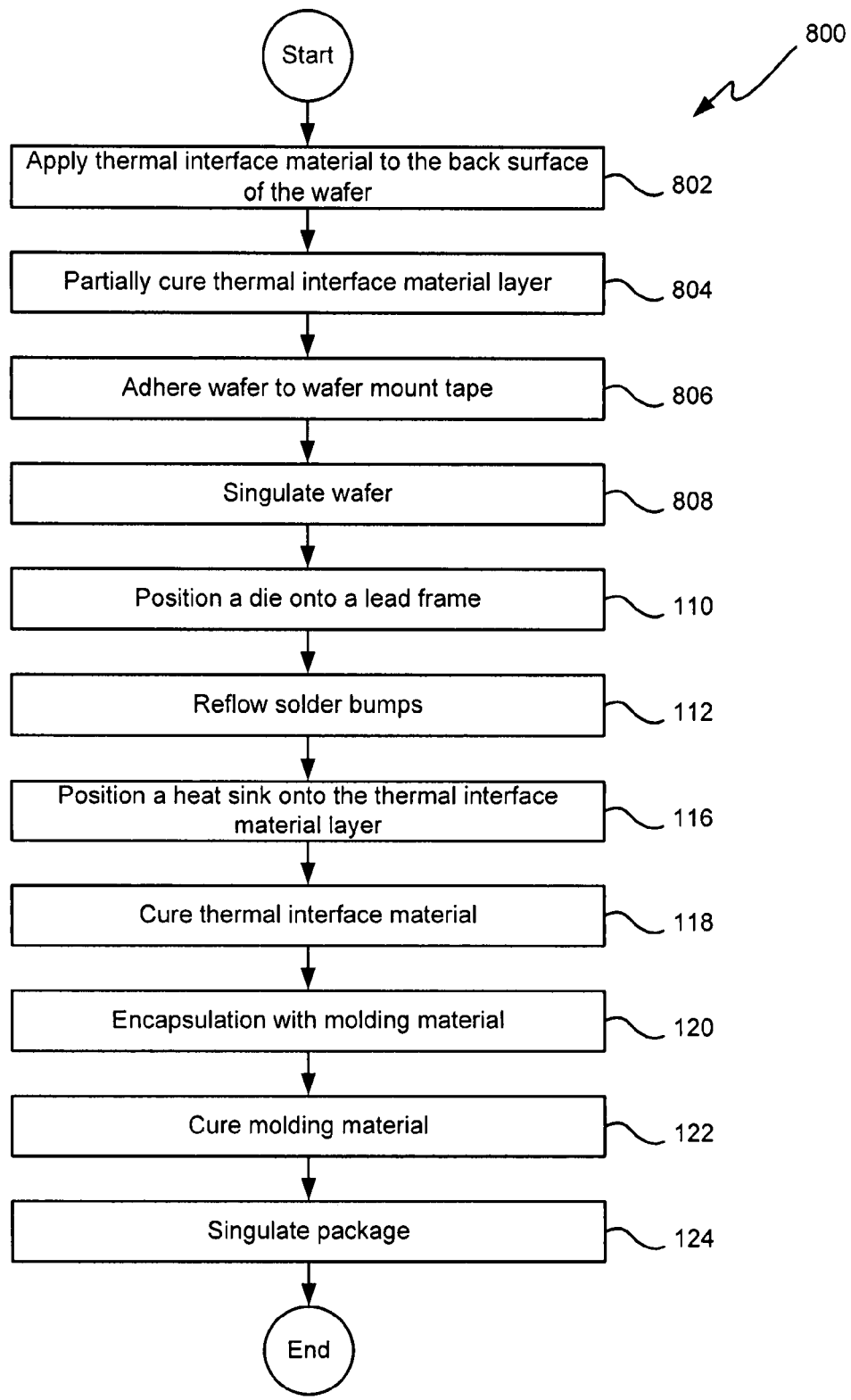
FIGS. 8A-8B are flowcharts illustrating a process for packaging IC dice with integrated heat sinks in accordance with some alternate embodiments of the present invention.

Various embodiments of an alternate method for producing IC packages having integrated heat sinks will now be described with reference to FIGS. 8A and 8B. The process 800 illustrated in FIG. 8A begins after the optional backgrinding step 104 of process 100. After the optional backgrinding, a thermal interface material layer is applied at 802 to the back surface of wafer 200.

Thermal interface material layer may be formed of any suitable material(s) such as those described with reference to thermal interface material layer 414. If a liquid material is used to form thermal interface material, the liquid may be applied using any of a variety of conventional wafer level methods including, by way of example, spin coating or screen printing, among others. In alternate embodiments, the thermal interface material layer may be rolled on or laminated onto the back surface of wafer 200.

In one particular embodiment, solder is used to form the thermal interface material. The solder may be deposited onto the back surface of the wafer 200 with any of a variety of convention methods including, by way of example, electroplating, thermal evaporation or as a liquid solder paste (It should be noted that solder may also be used as the thermal interface material 414 described in process 100). Prior to depositing the solder, the back surface of the wafer may be covered with a thin metallic layer or thin metallic layer stack in order to facilitate the application of the solder. The thin metallic layer may be formed from any suitable metal or metallic alloy. By way of example, the thin stacked metallic layer may be an alloy of titanium, nickel and silver. The thin stacked metallic layer may also be applied to the back surface of the wafer 200 with any suitable means including, for example, sputtering or thermal evaporation.

At 804 the thermal interface material layer may be partially cured if necessary. In one embodiment, the wafer 200 may then be adhered to a wafer mount tape at 806 and subsequently singulated at 808 into a plurality of integrated circuit dice 202. In this embodiment, the process 800 then proceeds according to process 100 beginning at step 110 of process 100. However, the step 114 of applying the thermal interface material layer 414 is now omitted.

However, in embodiments in which solder is used to form the thermal interface material layer, the heat sinks 414 may be positioned onto the back surfaces of the dice 202 prior to reflow at 112; that is, steps 112 and 116 may be reversed. In this way, during reflow of the solder bumps 206 to produce solder joints 406, the heat sinks 414 are simultaneously connected to the back surfaces of the dice 202 via the solder comprising the thermal interface material layer.

Figure 8B:
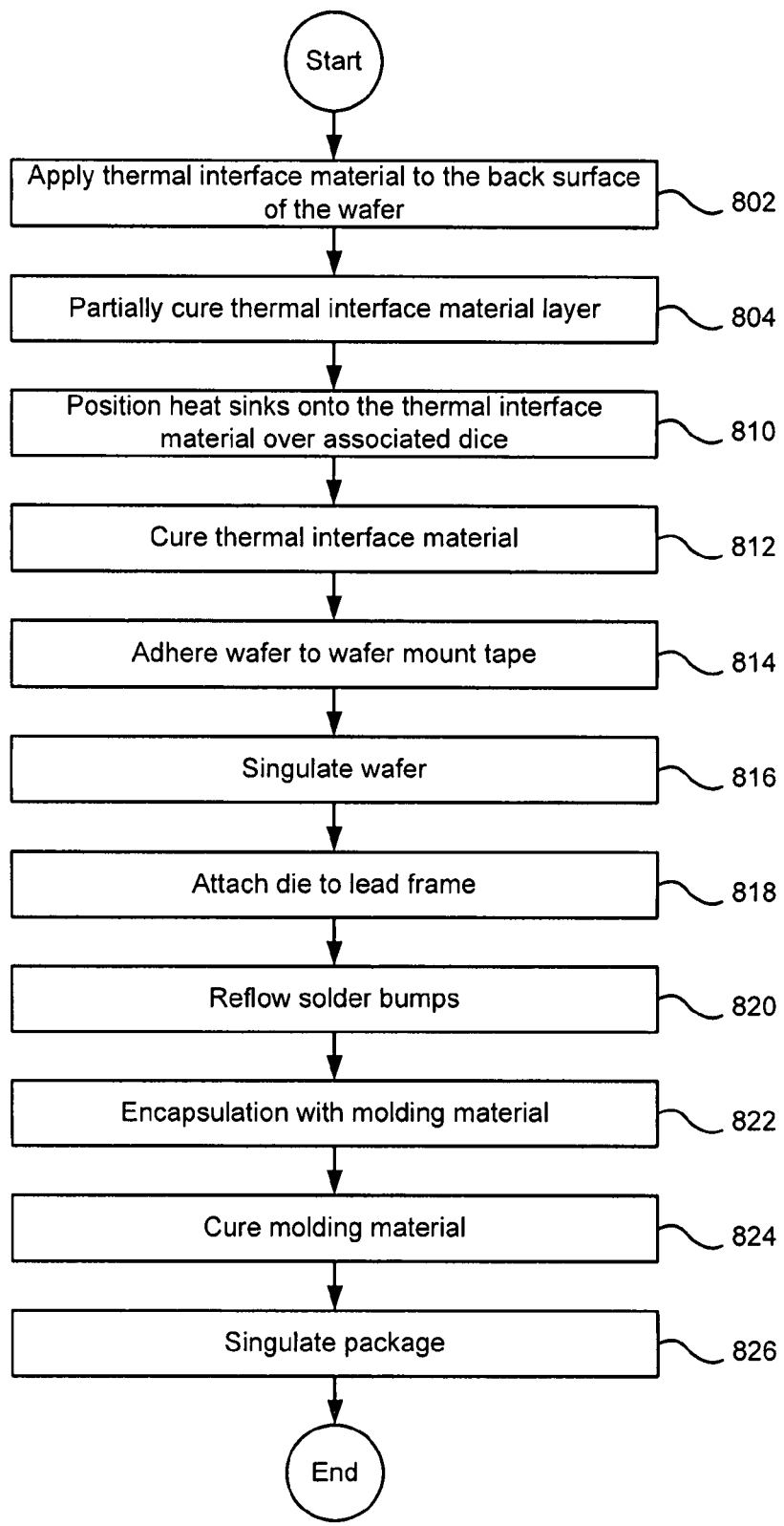

In another embodiment, after the thermal interface material layer is applied and cured (if appropriate), heat sinks 416 are positioned at the wafer level onto the back surfaces of the dice 202 at 810 as indicated by the process illustrated in FIG. 8B. In some embodiments, the thermal interface material layer is then cured at 812 to attach the heat sinks 414 to the back surfaces of associated dice 202. The wafer 200 may then be adhered to a wafer mount tape at 814 and subsequently singulated at 816 into a plurality of integrated circuit dice 202 each having a heat sink 416 on a back surface thereof.

Each singulated die 202 may then be attached to a suitable substrate such as lead frame panel 301 at 818. The solder bumps 206 may then be reflowed at 820 to physically and electrically connect the I/O pads on the active surfaces 204 of the dice 202 to the leads 309 of the lead frame panel 300. The dice 202, solder joints 406 and portions of the leads 309 and heat sinks 414 may then be encapsulated with molding material at 822 in the manner outlined in step 120 of process 100. The molding material may then be cured at 824. At 826, the lead frame panel is singulated to produce individual packages 430.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

By way of example, in some embodiments a die may be packaged without a lead frame. As will be appreciated those familiar with the art, flip-chip (FC) dice are examples of dice that are may be attached directly to PCBs without the use of lead frames or other intermediary substrates.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An integrated circuit package, comprising:
   a die, the die having an active surface and a back surface, the active surface including a plurality of I/O pads formed thereon;
   a thermal interface material layer, the thermal interface material layer having a first surface and a second surface substantially opposite the first surface, the first surface of the thermal interface material layer being attached to the back surface of the die;
   a heat sink, the heat sink including a base, a multiplicity of heat dissipation structures and a partition that extends from a top surface of the base, the base including a planar top surface and an opposing planar bottom surface and forming a substantially flat and solid metal layer such that all space directly between the top and bottom surfaces of the base are filled with metal, the back surface of the base being directly attached to the second surface of the thermal interface material layer, the partition extending around the periphery of the base and being offset from outer side surfaces of the base such that the partition and base form a ledge region that surrounds the periphery of the base, the ledge region being a portion of the top surface of the base, wherein inner surfaces of the partition define an inner region on the top surface of the base, the multiplicity of heat dissipation structures extending out from the inner region on the top surface of the base; and a molding material that encapsulates and covers at least portions of the die and the ledge region around the periphery of the heat sink while leaving the inner region of the heat sink unencapsulated by molding material and exposed, wherein the molding material covering the ledge region provides a locking feature that secures the heat sink in the package.

2. An integrated circuit package as recited in claim 1, further comprising:
    a leadframe, the leadframe including a plurality of leads, each lead having at least one solder pad and a contact surface that is distinct from the solder pad, the solder pad being suitably positioned to overlap a corresponding I/O pad on the die; and
    a plurality of solder joint connections that physically and electrically connect I/O pads on the active surface of the die to associated solder pads on the leads; and
    wherein the molding material encapsulates the solder joint connections and portions of the leads.

3. An integrated circuit package as recited in claim 1, wherein the base, the partition and the heat dissipation structures of the heat sink are integrally formed with one another.

4. An integrated circuit package as recited in claim 1, wherein the heat dissipation structures are posts or fins that extend vertically from the top surface of the base.

5. An integrated circuit package as recited in claim 1, wherein the heat dissipation structures are arranged in a two-dimension array.

6. An integrated circuit package as recited in claim 1, wherein the thermal interface material layer is formed of a thermally conductive adhesive material.

7. An integrated circuit package as recited in claim 6, wherein the thermal interface material layer is formed of an electrically insulating material.

8. An integrated circuit package as recited in claim 6, wherein the thermal interface material layer is formed of a B-stageable adhesive material.

9. An integrated circuit package as recited in claim 1, wherein the back surface of the die includes a metallic layer deposited thereon and wherein the thermal interface material is secured to the metallic layer.

10. An integrated circuit package as recited in claim 9, wherein the thermal interface material layer is formed of solder.

11. An arrangement, comprising:
    a plurality of dice, each die having an active surface and a back surface, the active surface including a plurality of I/O pads formed thereon, each die including a thermal interface material layer, the thermal interface material layer having a first surface and a second surface substantially opposite the first surface, the first surface of the thermal interface material layer being attached to the back surface of the die; a lead frame panel including an array of device areas, adjacent device areas being connected with associated tie bars, each device area being suitable to receive an associated die and including a plurality of leads, each lead having at least one solder pad and a contact surface that is distinct from the solder pad, the solder pad being suitably positioned to overlap a corresponding I/O pad on the die;
    a plurality of solder joint connections that physically and electrically connect I/O pads on the active surface of each die to associated solder pads on the leads of an associated device area;
    a plurality of heat sinks, each heat sink including a base, a multiplicity of heat dissipation structures and a partition that extends from a top surface of the base, the base including a planar top surface and an opposing planar bottom surface and forming a substantially flat and solid metal layer such that all space directly between the top and bottom surfaces of the base are filled with metal, the back surface of the base being directly attached to the second surface of the thermal interface material layer of an associated die, the partition extending around the periphery of the base and being offset from outer side surfaces of the base such that the partition and base form a ledge region that surrounds the periphery of the base, the ledge region being a portion of the top surface of the base, wherein inner surfaces of the partition define an inner region on the top surface of the base, the multiplicity of heat dissipation structures extending out from the inner region on the top surface of the base; and
    a molding material that encapsulates and covers at least portions of each die and the ledge region around the periphery of each heat sink while leaving the inner region of each heat sink unencapsulated by molding material and exposed, wherein the molding material covering the ledge region provides a locking feature that secures the heat sink in the package.

12. An arrangement as recited in claim 11, wherein the thermal interface material layer is formed of a thermally conductive adhesive material.

13. An arrangement as recited in claim 12, wherein the thermal interface material layer is formed of a B-stageable adhesive material.

14. An arrangement as recited in claim 11, wherein the back surface of each die includes a metallic layer deposited thereon and wherein the thermal interface material is secured to the metallic layer.

15. An arrangement as recited in claim 14, wherein the thermal interface material layer is formed of solder.

16. A method of securing heat sinks to back surfaces of integrated circuit dice, the method comprising:
    applying a thermal interface material layer onto a back surface of a die;
    attaching a heat sink to the thermal interface material layer on the back surface of the die, the heat sink including a base, a multiplicity of heat dissipation structures and a partition that extends from a top surface of the base, the base including a planar top surface and an opposing planar bottom surface and forming a substantially flat and solid metal layer such that all space directly between the top and bottom surfaces of the base are filled with metal, the back surface of the base being in direct contact with the thermal interface material layer on the associated die, the partition extending around the periphery of the base and being offset from outer side surfaces of the base such that the partition and base form a ledge region that surrounds the periphery of the base, the ledge region being a portion of the top surface of the base, wherein inner surfaces of the partition define an inner region on the top surface of the base, the multiplicity of heat dissipation structures extending out from the inner region on the top surface of the base; and
    encapsulating the die and portions of the heat sink with a molding material, wherein the molding material does not enter the inner region of the heat sink, and wherein the molding material covers portions of the ledge region of the heat sink whereby the molding material covering the ledge region provides a locking feature that secures the ledge region within the molding material thereby securing the heat sink to the thermal interface material and the die.

17. The integrated circuit package of claim 1, wherein the multiplicity of heat dissipation structures and the base are all integrally formed from a single piece of metal.

18. The integrated circuit package of claim 1, wherein:
the multiplicity of heat dissipation structures are evenly distributed across the entire top surface of the base, except for the ledge region; and
the multiplicity of heat dissipation structures are directly connected to the top surface of the base.

19. The integrated circuit package of claim 1, wherein:
the multiplicity of heat dissipation structures and the base are all formed by etching a single sheet of metal;
the multiplicity of heat dissipation structures are evenly distributed across the entire top surface of the base, except for the ledge region; and
the multiplicity of heat dissipation structures are directly connected to the top surface of the base.

20. The integrated circuit package of claim 1, wherein:
the partition extends out of the top surface of the base and has an exposed top surface that is elevated above the top surface of the base; and
the molding material encapsulates the ledge region and outer surfaces of the partition and includes an exposed surface that is substantially co-planar with the top surface of the partition.

21. The integrated circuit package of claim 20, wherein the molding material entirely covers and is in direct contact with the ledge region.

22. An arrangement of claim 11, wherein:
the partition of each heat sink extends out of the top surface of the base of the heat sink and has an exposed top surface that is elevated above the top surface of the base; and
the molding material encapsulates the ledge region of each heat sink and outer surfaces of the partition of each heat sink and includes an exposed surface that is substantially co-planar with the top surface of the partition.

23. The method of claim 16, wherein:
the partition extends out of the top surface of the base and has an exposed top surface that is elevated above the top surface of the base; and
the encapsulating of the die and portions of the heat sink involves encapsulating the ledge region and outer surfaces of the partition with the molding material such that the molding material has an exposed surface that is substantially co-planar with the top surface of the partition.

24. The method of claim 16 further comprises:
pressing the top surface of the partition against a mold cavity to help seal off the inner region where the heat dissipation structures are located, wherein during the encapsulating of the die and portions of the heat sink with the molding material, the partition helps prevent the molding material from coming in contact with the inner region and the heat dissipation structures.

* * * * *